United States Patent
Doczy et al.

(10) Patent No.: US 7,575,991 B2
(45) Date of Patent: Aug. 18, 2009

(54) REMOVING A HIGH-K GATE DIELECTRIC

(75) Inventors: Mark L. Doczy, Beaverton, OR (US);
Robert L. Norman, Troutdale, OR (US);
Justin K. Brask, Portland, OR (US);
Jack Kavalieros, Portland, OR (US);
Matthew Metz, Hillsboro, OR (US);
Suman Datta, Beaverton, OR (US);
Robert S. Chau, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 764 days.

(21) Appl. No.: 10/882,733

(22) Filed: Jun. 30, 2004

(65) Prior Publication Data
US 2006/0003499 A1   Jan. 5, 2006

(51) Int. Cl.
*H01L 21/3205* (2006.01)
*H01L 21/4763* (2006.01)
(52) U.S. Cl. ..................... 438/591; 438/762
(58) Field of Classification Search ............ 438/762, 438/475, 287, 591
See application file for complete search history.

(56) References Cited

U.S. PATENT DOCUMENTS

| | | | |
|---|---|---|---|
| 6,696,345 B2 * | 2/2004 | Chau et al. | 438/387 |
| 2005/0104112 A1 * | 5/2005 | Haukka et al. | 257/310 |
| 2007/0172997 A1 * | 7/2007 | Yagishita et al. | 438/142 |

OTHER PUBLICATIONS

U.S. Appl. No. 10/652,796, filed Aug. 28, 2003, Justin K. Brask et al., *A Method For Making A Semiconductor Device Having A High-K Gate Dielectric*.
U.S. Appl. No. 10/805,880, filed Mar. 22, 2004, Uday Shah et al., *A Method For Making A Semiconductor Device With A Metal Gate Electrode*.

* cited by examiner

*Primary Examiner*—Phat X Cao
(74) *Attorney, Agent, or Firm*—Trop, Pruner & Hu, P.C.

(57) ABSTRACT

A metal oxide layer on a substrate is converted at least partly to a metal layer. At least part of the metal layer is covered by an oxidation resistant cover. The covered layer and underlying metal may be removed, for example, using acid.

10 Claims, 3 Drawing Sheets

REMOVING A HIGH-K GATE DIELECTRIC

BACKGROUND

This invention relates generally to methods for making semiconductor devices, in particular, semiconductor devices that include high dielectric constant (k) gate dielectric layers.

MOS field-effect transistors with very thin silicon dioxide based gate dielectrics may experience unacceptable gate leakage currents. Forming the gate dielectric from certain high-k dielectric materials, instead of silicon dioxide, can reduce gate leakage.

High-k gate dielectric materials may be difficult to pattern and remove. Thus, better techniques for removing high-k gate dielectrics are needed.

Features shown in these FIGURES are not intended to be drawn to scale.

DETAILED DESCRIPTION

Figure 1A:
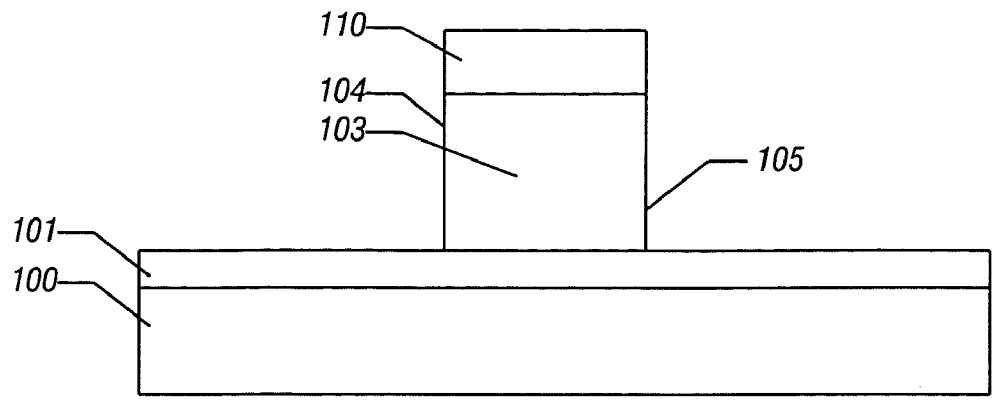
FIGS. 1a-1g represent cross-sections of structures that may be formed when carrying out an embodiment of the method of the present invention.

Referring to FIG. 1a, the substrate 100 may comprise a bulk silicon or silicon-on-insulator substructure. Alternatively, the substrate may comprise other materials—which may or may not be combined with silicon—such as: germanium, indium antimonide, lead telluride, indium arsenide, indium phosphide, gallium arsenide, or gallium antimonide. Although several examples of materials from which the substrate 100 may be formed are described here, any material that may serve as a foundation upon which a semiconductor device may be built falls within the spirit and scope of the present invention.

When the substrate 100 comprises a silicon wafer, the wafer may be cleaned before forming the metal oxide layer on its surface. To clean the wafer, it may initially be exposed to a dilute hydrofluoric acid ("HF") solution, e.g., a 50:1 water to HF solution. The wafer may then be placed in a megasonic tank, and exposed first to a water/$H_2O_2$/$NH_4OH$ solution, then to a water/$H_2O_2$/HCl solution. The water/$H_2O_2$/$NH_4OH$ solution may remove particles and organic contaminants, and the water/$H_2O_2$/HCl solution may remove metallic contaminants.

After that cleaning treatment, metal oxide layer 101 is formed on substrate 100, generating the structure illustrated by FIG. 1a. Materials for making the metal oxide layer 101 include any material that can be used to form a high dielectric constant material. A high dielectric constant is a constant greater than 10. Examples of such materials include hafnium oxide, hafnium silicon oxide, lanthanum oxide, lanthanum aluminum oxide, zirconium oxide, zirconium silicon oxide, titanium oxide, tantalum oxide, barium strontium titanium oxide, barium titanium oxide, strontium titanium oxide, yttrium oxide, aluminum oxide, and lead scandium tantalum oxide. Particularly preferred are hafnium oxide, zirconium oxide, titanium oxide, and aluminum oxide. Although a few examples of materials that may be used to form metal oxide layer 101 are described here, that layer may be made from other materials, as will be apparent to those skilled in the art.

Metal oxide layer 101 may be formed on substrate 100 using a conventional deposition method, e.g., a conventional chemical vapor deposition ("CVD"), low pressure CVD, or physical vapor deposition ("PVD") process. Preferably, a conventional atomic layer CVD process is used. In such a process, a metal oxide precursor (e.g., a metal chloride) and steam may be fed at selected flow rates into a CVD reactor, which is then operated at a selected temperature and pressure to generate an atomically smooth interface between substrate 100 and metal oxide layer 101. The CVD reactor may be operated long enough to form a layer with the desired thickness. In most applications, metal oxide layer 101 may be less than about 40 Angstroms thick, and more preferably between about 5 Angstroms and about 20 Angstroms thick—i.e., less than or equal to about 5 monolayers thick.

A patterned polysilicon layer may be created by first forming a hard mask that covers part of the polysilicon layer, and leaves part of that layer exposed. Such a hard mask may comprise silicon nitride, silicon dioxide, silicon oxynitride, or a nitrided silicon dioxide. The hard mask may be between about 100 Angstroms and about 500 Angstroms thick, and may be deposited and patterned using conventional techniques. The exposed part of the polysilicon layer may then be removed using a dry etch process. Such a dry etch process may employ a plasma that is derived from a combination of gases, e.g., a combination of hydrogen bromide, chlorine, argon, and oxygen. The optimal process for etching the polysilicon layer may depend upon the degree to which the polysilicon layer is doped, and the desired profile for the resulting etched layer.

Figure 1B:
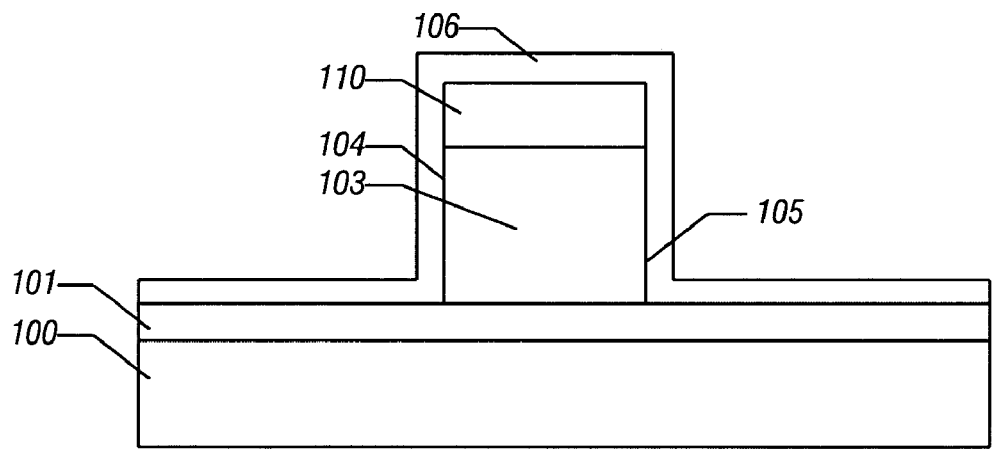

Hard mask 110 may be retained after masking layer 103 is formed to protect masking layer 103 during subsequent etching operations. After forming the FIG. 1a structure, first side 104 and second side 105 of masking layer 103 are lined with a sacrificial layer. To line sides 104, 105 with a sacrificial layer, layer 106 is initially deposited onto metal layer 102, hard mask 110, and sides 104, 105 of masking layer 103, generating the FIG. 1b structure.

Examples of materials that may be used to form layer 106 include silicon nitride, a carbon doped silicon nitride, and silicon dioxide. Preferably, layer 106 comprises a material that may be etched selectively to hard mask 110. Layer 106 may be deposited onto metal layer 102, hard mask 110 and sides 104, 105, using a conventional CVD process. In a preferred embodiment, layer 106 has a relatively uniform thickness of between about 10 Angstroms and about 100 Angstroms, and more preferably of between about 30 Angstroms and about 50 Angstroms.

Figure 1C:
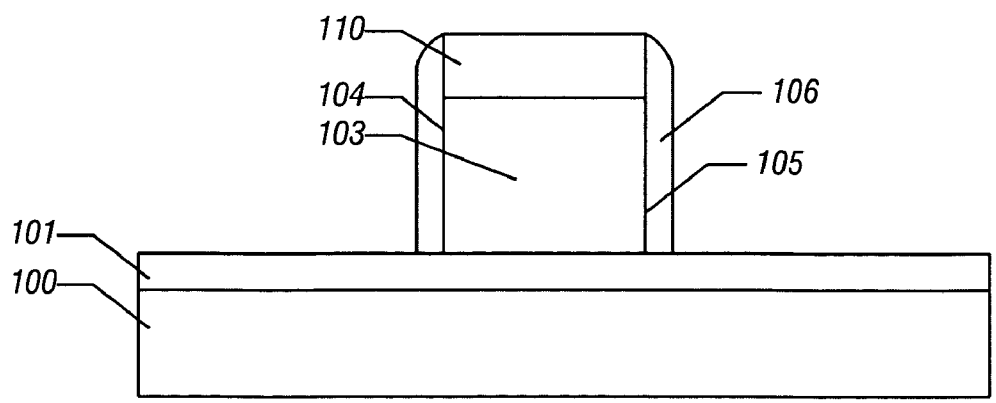

After layer 106 is deposited, an anisotropic plasma dry etch process may be applied to remove the horizontal portions of the sacrificial layer 106, generating the FIG. 1c structure. Such a process may employ a plasma that is derived from a combination of $CH_3F$, carbon monoxide, oxygen and argon. That process step leaves layer 101 exposed, except where masking layer 103 covers that layer—while layer 106 continues to protect sides 104, 105.

Part or all of metal oxide layer 101 may be converted into metal layer 102 via a chemical reduction process that uses conventional equipment, materials, and operating conditions. In such a chemical reduction process, metal oxide layer 101 may be converted to metal by exposing metal oxide layer 101 to hydrogen, which may be contained in a hydrogen containing gas or a hydrogen based plasma.

When a hydrogen containing gas is used, it may comprise hydrogen, or, alternatively, include hydrogen and an inert gas, e.g., helium or argon. When including an inert gas, the hydrogen containing gas may comprise about 5% hydrogen. Prior to exposing metal oxide layer 101 to such a hydrogen containing gas, the reaction chamber may be purged to prevent undesirable reaction between layer 101 and oxygen or nitrogen. The reduction process may take place under ambient conditions.

When metal oxide layer 101 is less than or equal to about 20 Angstroms thick, substantially all of that layer may be reduced to metal by feeding enough hydrogen into the reaction chamber to remove substantially all of the oxygen included in metal oxide layer 101. To remove the oxygen and a significant amount of impurities, the ratio of hydrogen atoms (fed into the reaction chamber) to the number of oxygen atoms (contained in the metal oxide layer) must exceed 2:1.

When metal oxide layer 101 is reduced to metal by exposing it to a hydrogen based plasma, a direct plasma enhanced chemical vapor deposition ("PECVD") process or a remote plasma enhanced chemical vapor deposition ("RPECVD") process may be used. In such a PECVD or RPECVD process, metal oxide layer 101 may be reduced to metal by exposing it to hydrogen and to certain ionized species generated by a plasma source. When a PECVD process is used, such ionized species may be generated by feeding hydrogen and an inert gas into the reactor, then striking a plasma within the reactor. When a RPECVD process is used, the plasma may be stricken remotely, followed by feeding the resulting ionized species and hydrogen (or a mixture of hydrogen and an inert gas) into the reactor—downstream from the plasma source.

When metal oxide layer 101 is less than about 20 Angstroms thick, the reactor may be operated under the appropriate conditions (e.g., temperature, pressure, radio frequency, and power) for a sufficient time to reduce all (or substantially all) of metal oxide layer 101 to metal. When layer 101 is significantly greater than 20 Angstroms thick, the reactor may be operated long enough to reduce the upper portion of that layer.

Although a few examples of processes that may be used to reduce at least part of metal oxide layer 101 to metal are described here, other reducing operations may be used, as will be apparent to those skilled in the art. Examples include other types of wet or dry chemical reducing processes, e.g., those that use aqueous solutions or plasmas with different reducing agents. Various combinations of these processes may also be employed.

As an alternative to such chemical reduction processes, an electrochemical reduction operation may be used. In such a process, metal oxide layer 101 is placed into a chemical bath. By passing an electric current through the bath, part or all of metal oxide layer 101 may be reduced to metal. Processes that may be used to reduce metal oxide layer 101 to metal are not limited to those described above.

Figure 1D:
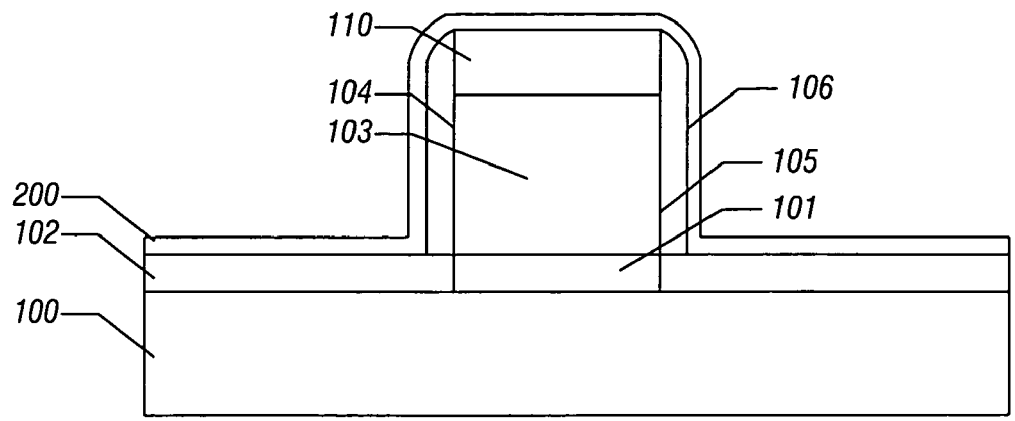
Figure 1E:
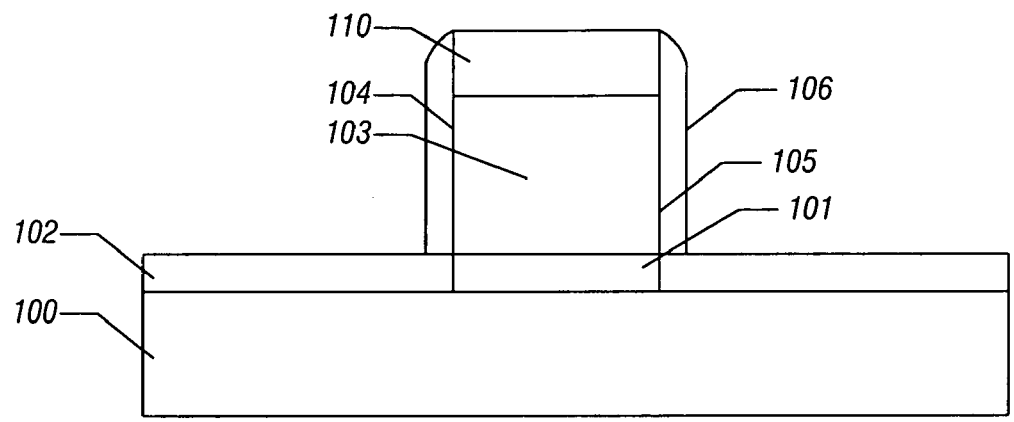
Figure 1F:
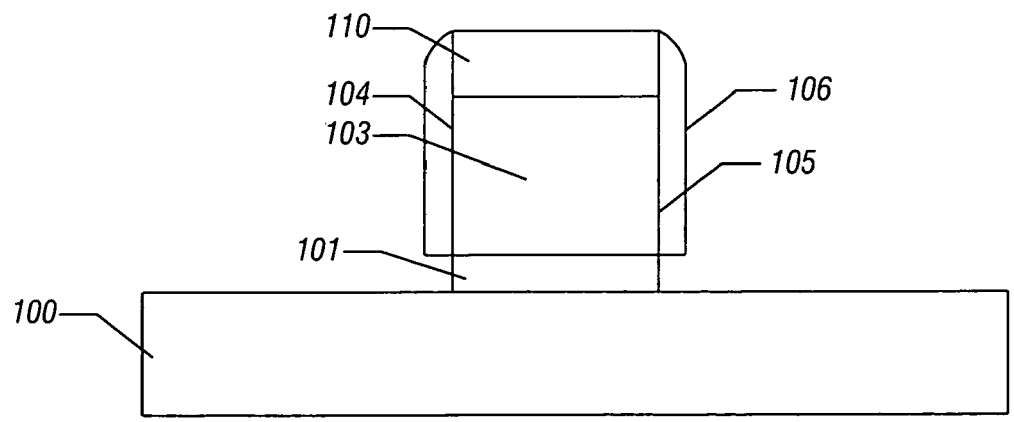

Regions of the reduced layer 101 to be removed may be covered with a layer 200 (FIG. 1D) in the same chamber used to reduce the layer 101. The layer 200 may be a cap layer that is soluble in acid in one embodiment of the present invention. The layer 200 may include a metal such as titanium nitride or aluminum or other acid soluble materials such as silicon nitride. The layer 200 may be from 25 to 100 Angstroms thick in some embodiments. The layer 200 is effective to prevent reoxidation of the underlying layer 102, for example, while the wafer is being transferred to another station at which station the layer 101 will be removed. Reoxidation would make it more difficult to remove the layer 101 by acid treatments. If the layer 200 is removable by acid treatments to generate the FIG. 1E structure and the reduced layer 101 is removable by acid treatments, the layer 101 can be readily removed by acid exposure to produce the clean substrate 100 shown in FIG. 1F. The acid treatment may include sulfuric or phosphoric acid, as examples.

Figure 1G:
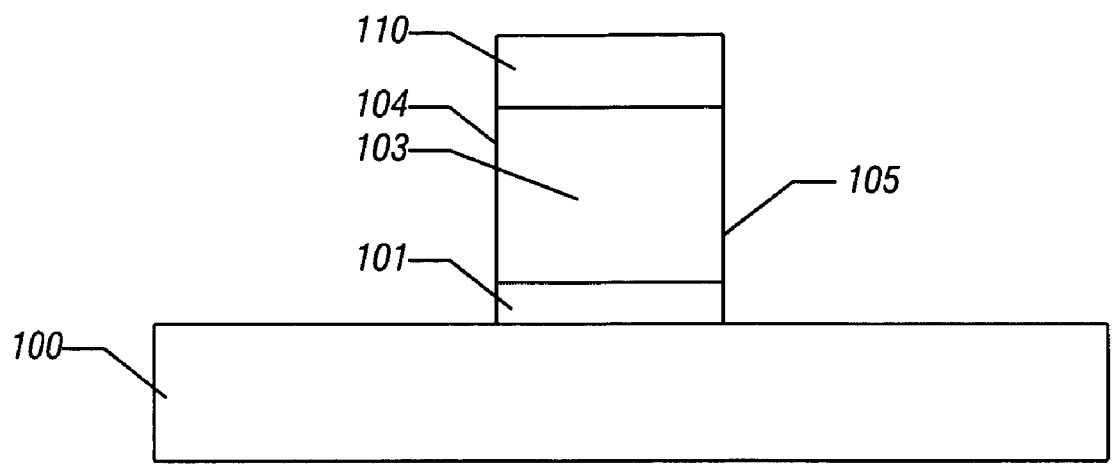

In the illustrated embodiment, at least some of sacrificial layer 106 remains after the exposed part of dielectric layer 101 has been removed. The remaining part of that sacrificial layer is then removed, generating the FIG. 1G structure. A wet etch process may be applied to remove the remaining portion of layer 106. Although in this embodiment some of sacrificial layer 106 remains after dielectric layer 101 has been etched, in other embodiments the wet etch processes that remove part of metal layer 102 and the exposed part of dielectric layer 101 may remove the remainder of sacrificial layer 106 at the same time.

Process steps for completing the device that follow removal of the sacrificial layer, e.g., forming sidewall spacers on the gate electrode stack, source and drain regions and the device's contacts, are well known to those skilled in the art and will not be described in more detail here. In this regard, using dummy doped polysilicon layers for masking layer 103 may enable one to apply commonly used nitride spacer, source/drain, and silicide formation techniques, when completing the structure. During those subsequent process steps, hard mask 110 may be retained to prevent a significant part of masking layer 103 from being converted into a silicide. Conversely, if it is desirable to subsequently convert part or all of masking layer 103 into a silicide, then hard mask 110 must be removed beforehand.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A method for making a semiconductor device comprising:
    forming a metal oxide layer over a substrate;
    reducing at least part of the metal oxide layer to a metal layer by exposing the metal oxide layer to hydrogen; and
    covering at least part of said metal layer with an oxidation resistant layer.

2. The method of claim 1 wherein the metal oxide layer is formed by atomic layer chemical vapor deposition.

3. The method of claim 2 further comprising forming metal oxide layers having a dielectric constant greater than 10.

4. The method of claim 1 including covering with an acid soluble oxidation resistant layer.

5. The method of claim 4 including removing at least a portion of said oxidation resistant layer and the underlying metal layer using acid.

6. The method of claim 1 including removing the converted part of said metal oxide layer and leaving an unconverted part of said metal oxide layer as part of a gate stack.

7. A method for making a semiconductor device comprising:
    forming a metal oxide layer on a substrate;
    reducing the metal oxide layer to a metal layer by exposing the metal oxide layer to hydrogen;
    covering said metal layer with an oxidation resistant layer; and
    removing a covered portion of said metal layer and said oxidation resistant layer.

8. The method of claim 7 wherein the metal oxide layer is formed by atomic layer chemical vapor deposition.

9. The method of claim 8 further comprising forming metal oxide layers having a dielectric constant greater than 10.

10. The method of claim 7 including removing the covered portion of said metal layer and said oxidation resistant layer using acid.

\* \* \* \* \*